(12) United States Patent
Palka

(10) Patent No.: US 12,283,784 B2
(45) Date of Patent: Apr. 22, 2025

(54) SYSTEM AND METHOD FOR INDICATING VOLTAGE USING A TWIST ON CONNECTOR

(71) Applicant: Daniel S. Palka, Warren, NJ (US)

(72) Inventor: Daniel S. Palka, Warren, NJ (US)

(*) Notice: Subject to any disclaimer, the term of this patent is extended or adjusted under 35 U.S.C. 154(b) by 439 days.

(21) Appl. No.: 17/676,122

(22) Filed: Feb. 19, 2022

(65) Prior Publication Data

US 2023/0268674 A1 Aug. 24, 2023

(51) Int. Cl.
*H01R 4/22* (2006.01)
*G01R 19/155* (2006.01)
*H01R 4/12* (2006.01)

(52) U.S. Cl.
CPC ............. *H01R 4/22* (2013.01); *G01R 19/155* (2013.01); *H01R 4/12* (2013.01); *H01R 2201/20* (2013.01)

(58) Field of Classification Search
USPC .......................................... 324/713
See application file for complete search history.

(56) References Cited

U.S. PATENT DOCUMENTS 6,608,487 B2 * 8/2003 De Angelis ........... B66B 7/1223
73/158

* cited by examiner

*Primary Examiner* — Farhana A Hoque

(57) ABSTRACT

A voltage indicating twist-on wire connector configurable for indicating whether voltage is present in at least one electrical line connected to the connector, the connector comprising a housing, a spiral coil, a set of contacts, a resistor, and an indicator, wherein the spiral coil, the set of contacts, the resistor, and the indicator are electrically connected together on a circuit. A testing tool is used in combination with the connector, the testing tool comprising a housing, a coil winding, and a set of spring loaded contacts, wherein the testing tool is configurable to actuate the connector, causing the connector to illuminate if electrical voltage is present in at least one wire connected to the connector.

3 Claims, 3 Drawing Sheets

SYSTEM AND METHOD FOR INDICATING VOLTAGE USING A TWIST ON CONNECTOR

FIELD OF THE INVENTION

This disclosure relates to measuring and indicating voltage of live electrical lines. The invention relates generally to electrical connectors that connect multiple wires together. More specifically, the invention relates to a voltage indicating twist-on wire connector that can indicate whether voltage is present in a set of wires electrically connected together by the connector.

BACKGROUND

A live electrical wire should be tested whenever there is work performed near or on electrical systems. To prevent electrical shock when installing electrical lines, the installer needs to be aware of whether electrical current is flowing through a particular wire. Electric shock may be very dangerous, as an electrical current unintentionally passing through the housing can cause breathing difficulty, convulsions, cardiac arrest, or even death. Traditionally, to test for a live electrical wire, either a non-contact voltage tester or a digital multimeter may be used. A non-contact voltage tester may be used for testing live wires by placing the machine near the wire to be tested and observing for an indication that electrical current is passing through a wire. A digital multimeter may be used by attaching two probes to a wire and measuring electrical properties such as voltage, current, resistance, and amps, and displaying those measurements on a screen. However, both non-contact voltage testers and digital multimeters may be limited in terms of their functionality. For example, non-contact testers may not be suitable for inspecting wires that are covered with a metal sheath or conduit. In addition, both non-contact testers and digital multimeters may be limited by their power source, in that requiring a power source may require constantly changing the battery of the device as needed or requiring the device to be plugged into an external power source.

A twist-on wire connector (also known as a "twist-on connector" or "wire nut") is a type of electrical connector typically used to fasten two or more low-voltage electrical conductors. They are widely used in North America in residential, commercial, and industrial building power wiring. When a twist-on connector is twisted onto the stripped ends of wires, the wires are drawn into the connector's metal insert and squeezed together inside it. Electrical continuity is maintained by both the direct twisted wire-to-wire contact and by contact with the metal insert.

Twist-on wire connectors are typically installed by hand. After a twist-on connector is installed, the installer needs a way to safely determine whether electrical current is passing through the wires coupled together by the connector. Currently, there are no twist-on wire connectors in existence capable of instantly indicating whether electrical current is passing through a spliced together set of wires. There is a need for a system and method for accurately, safely, and efficiently indicating whether current is passing through a live electrical line. Accordingly, there is a need for an electrical connector that quickly, reliably, and safely connects wires to each other and indicates whether voltage is present in said connected wires. In view of the millions or billions of connectors installed in electrical systems every year, such connectors should be able to quickly, reliably, and safely indicate whether voltage is present in a set of wires connected together, in order to greatly reduce the number of electrical shock injuries that occur each year. There is a need for a voltage indicating twist-on wire connector and for methods of installing and using the connectors, wherein the installer may be certain of whether or voltage is present in the electrical line(s) secured by the connector(s). This disclosure includes systems and methods for indicating voltage of a line wire using a Voltage Indicating Twist-on Connector ("VITOC").

SUMMARY OF THE INVENTION

The following invention comprises a voltage indicating twist-on connector, the connector comprising a housing, a spiral coil, a set of contacts, a resistor, and an indicator, wherein the spiral coil, the set of contact, the resistor, and the indicator are electrically connected together on a circuit disposed on the connector. A testing tool may be used in combination with the connector, the testing tool comprising a housing, a coil winding, and a set of spring loaded contacts, wherein the testing tool is configurable to actuate the connector, causing the connector to illuminate if electrical voltage is present in at least one wire connected to the connector. The installer may strip a wire or wire(s), insert the wire(s) into the connector, twist the connector to secure the wires to the connector and electrically connect the wires to the circuit of the connector and to each other, cover the connector with a testing tool so that the spring loaded contacts of the testing tool line up with the contacts of the connector, squeeze the spring loaded contacts thereby completing the circuit of the connector, and observe whether the indicator illuminates, indicating that electrical voltage is present in at least one wire connected to the connector.

BRIEF DESCRIPTION OF THE DRAWINGS

The following drawings are intended to serve as exemplary embodiments of the features disclosed in the present disclosure.

DETAILED DESCRIPTION OF DRAWINGS

Figure 1:
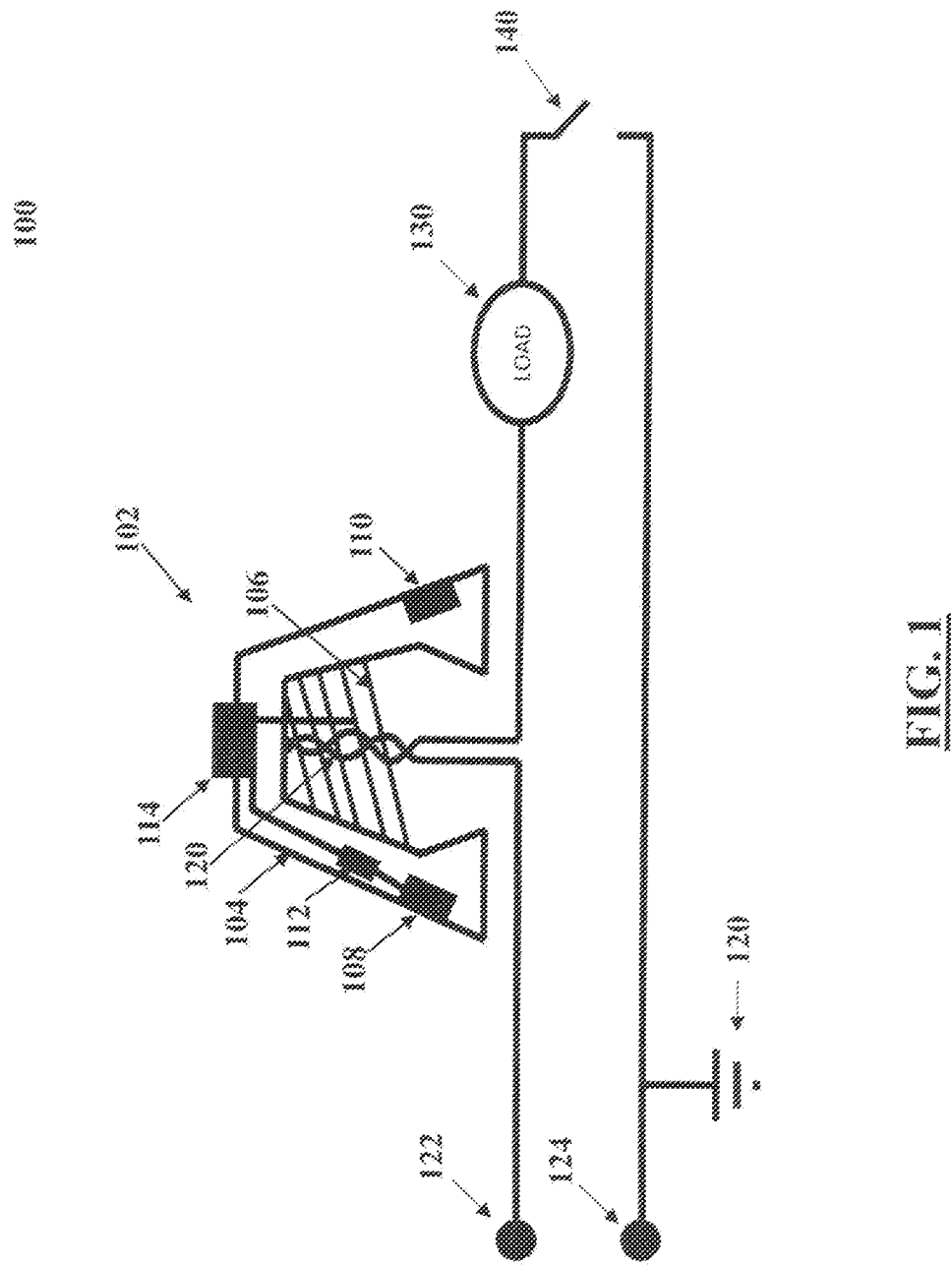
FIG. 1 is a diagram illustrating an exemplary implementation of a voltage indicating twist-on wire connector, in accordance with the present disclosure.

The description of illustrative embodiments according to principles of several illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits are illustrated by reference to certain exemplified embodiments and may not apply to all embodiments.

The various embodiments described herein describe a system and method relating to indicating whether current is passing through a wire using a voltage indicating twist on connector ("VITOC"). It should be understood by one having ordinary skill in the art from the present disclosure that phrases such as "indicating voltage of a line", "indicating whether current is passing through a wire", and like phrases may be used interchangeably. The invention in the present disclosure is characterized by its capability to indicate whether electrical voltage is present in a given line. The invented connector allows for one or more stripped electrically conductive wires, cables, or other elements to be connected to each other stripped conductive wires, cables, or elements. The invented connectors may be used with wire, cable, and other elongated conducting material, and terms such as "wire", "cable", and like should be understood by one having ordinary skill in the art to be interchangeable. Furthermore, words and phrases such as "electrician", "installer", "user" and the like are all intended to be understood by one having ordinary skill in the art to be interchangeable, and to refer to the person who is using the invention in this present disclosure.

Accordingly, the invention expressly should not be limited to such exemplary embodiments illustrating some possible non-limiting combination of features that may exist alone or in other combinations of features; the scope of the claimed invention being defined by the claims appended hereto.

This disclosure describes the best mode or modes of practicing the invention as presently contemplated. This description is not intended to be understood in a limiting sense, but rather provides an example of the invention presented solely for illustrative purposes by reference to the accompanying drawings to advise one of ordinary skill in the art of the advantages and construction of the invention. In the various views of the drawings, like reference characters designate like or similar parts.

One of the objects of the invention is to instantly indicate to a user whether voltage is present in a line.

Another object of the invention is to increase the safety of installing electrical lines by reducing the risk of electric shock by indicating to a user whether electrical current is passing through a particular spliced together set of wires.

Another object of the invention is to increase the efficiency at which electrical lines are installed.

Another object of the invention is to increase the effectiveness of locating faults in electrical systems.

The present disclosure includes a system and method relating to indicating voltage in a wire using a voltage indicating twist-on connector ("VITOC"). As mentioned hereinabove, the use of VITOCs in installing electrical lines may greatly reduce the likelihood of electric shock. Electric shock, also known as electrical injury, is a physiological reaction caused by electric current passing through the body. The injury depends on the density of the current, tissue resistance and duration of contact. Very small currents may be imperceptible or produce a light tingling sensation. A shock caused by low and otherwise harmless current could startle an individual and cause injury due to jerking away or falling. Stronger currents may cause some degree of discomfort or pain, while more intense currents may induce involuntary muscle contractions, preventing the person from breaking free of the source of electricity. Still larger currents result in tissue damage and may trigger ventricular fibrillation or cardiac arrest. Injuries from exposure to electricity may also include amputations, fractures and orthopedic and musculoskeletal injuries. Electric injury occurs upon contact of a body part with electricity that causes a sufficient current to pass through the person's tissue. Contact with energized wiring or devices is the most common cause. Accordingly, there is a need for electricians to be able to instantly recognize whether or not cut-rent is passing through a particular electrical line.

The present disclosure includes a voltage indicating twist-on connector ("VITOC") that is capable of instantly indicating to an electrician whether or not current is passing through a particular spliced together set of wires. Furthermore, this present disclosure also includes a method for installing electrical lines using VITOCS.

The exemplary embodiment of the VITOC in the present disclosure may form electrical contact by tightening of an electrically conductive spiral around an uninsulated wire or wires. The spiral coils around the wires multiple times and tightens on the wire(s) when the twist-on connector is rotated around the wire(s) inserted into the connector. The preferred conductive spiral receives multiple stripped wires, and upon tightening, forces said multiple stripped wires into electrical contact with each other and with the spiral. Furthermore, the spiral is electrically connected to combination of electrical components, including but not limited to, a set of contacts, a resistor, and an indicator, wherein the said combination of electrical components may be fixed together in a circuit that may be configurable for indicating whether voltage is present in the spliced together wires connected by the voltage indicating twist-on connector. By inserting the wires into the spiral of the connector and rotating the body of the connector, the wires may be gripped by the spiral and may become electrically connected to the contacts, resistor, and indicator, along the electrical circuit coupled to the interior surface of the housing of the connector. The engagement of the conductive spiral against the stripped wires forms an electrical connection between the conductive spiral, the said electrical components, as well as to each other. Furthermore, to actuate the invention in the present disclosure, the installer may use a testing tool as described hereinbelow in greater detail in the present disclosure. The contacts on the connector may be in a normally open position, wherein the installer may use the testing tool to configure the contacts to be in a closed position, thereby closing the circuit, and causing the indicator to illuminate, indicating that voltage is present in an electrical line.

The preferred housing of the connector is a preferably a sleeve that encircles the spiral and provides a means for securing an end of said spiral so that the spiral end is in a fixed position coupled to the interior surface of the housing, the housing having an opening on the proximal end for the insertion of a wire, and a closed butt-end on the distal end to block wires from extending past the connector. The housing may be different shapes and sizes, may optionally include grips or wings that increase the grip of the installer when rotating the connector, may be of different colors in accordance with a color coding for different wire gauges and types, as well as may be transparent, opaque, or translucent.

FIG. 1 is a diagram illustrating an exemplary system for indicating voltage using a voltage indicating twist-on connector, as shown in accordance with the present disclosure. With reference to FIG. 1, one exemplary embodiment of the invented voltage indicating twist-on connector, with an electrical cable installed in the connector, is shown. Accordingly, the system illustrated in FIG. 1 may be configurable to indicate whether there is voltage in a particular set of spliced wires coupled together by the said voltage indicating twist-on connector. With continued reference to FIG. 1, the system 100 may include, but is not limited to, a voltage indicating twist-on connector ("VITOC") 102, wherein the VITOC 102 may comprise of a housing 104, a spiral coil 106, a set of contacts comprising of a first contact 108 and a second contact 110, a resistor 112, and an indicator 114. The spiral coil 106 may be coupled to the interior surface of housing 104 so that when two wires are inserted into the housing 104 and the user subsequently twists the VITOC 102 the wires inserted into the housing 104 are connected together via the spiral coil 106 and secured into a fixed position by the spiral coil 106. First, the installer may strip the insulation from the end of a wire or wires. Second, the installer may insert the uninsulated end(s) of wire(s) into the spring coil 106 coupled on the interior surface of the housing 104 of the VITOC 102. Third, the installer may twist or rotate the housing 104, wherein twisting the housing of the connector cause the wire(s) to become secured to the VITOC, wherein the wires become electrically connected to the VITOC and to each other.

Furthermore, it is contemplated that wires may be twisted together before being inserted into the housing 104 or may be individually inserted into the connector without first twisting the individual wires together. In either case, the wires will be connected together and secured in a fixed position in the spiral coil 106 upon twisting the VITOC 102. Furthermore, although the present disclosure includes an exemplary embodiment of the invention including a twist-on connector as the voltage indicating connector, it is contemplated that other suitable butt-end style connectors may be used, such as, but not limited to, push-in connectors.

Figure 2:
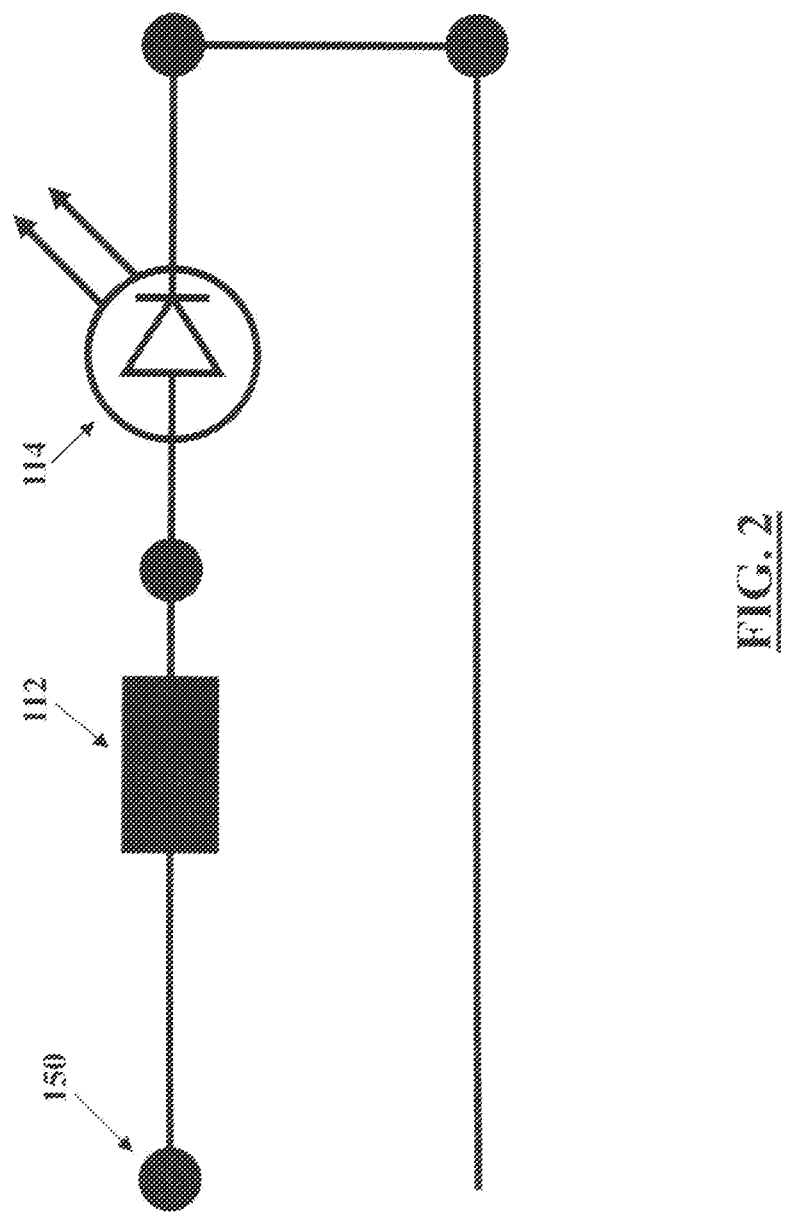
FIG. 2 is an additional diagram illustrating an exemplary implementation of a circuit coupled to the voltage indicating twist-on wire connector, in accordance with the present disclosure.

With continued reference to FIG. 1, the exemplary embodiment of the system as shown and described in the present disclosure includes a load line 122 connected to a neutral line 124, wherein the load line 122 includes a set of spliced together wires 120 attached to the spiral coil 106 coupled to the VITOC 102. Accordingly, the VITOC 102 may be configurable to indicate whether current is flowing through a set of spliced together wires 120 coupled together by the said VITOC 102. Once the installer has coupled together two or more wires using a VITOC 102 the installer may then subsequently check if voltage is present in the line by actuating the VITOC 102 using a testing tool 200 as shown in FIG. 2 and described in greater detail hereinbelow. It is contemplated that the housing 104 of the VITOC 102 may be different sizes to suit different gauge sizes of wires, and accordingly the VITOC 102 may be configurable with any size gauge wire. For example, the most common sizes in residential work are 14-gauge and 12-gauge wires. Larger appliances such as electric stoves, electric water heaters, electric dryers and central air units will often use 10-, 8- or even 6-gauge wire. It should be understood by one having ordinary skill in the art that the exemplary embodiment of the invention disclosed in the present disclosure is not limited by the size of the gauge of the wire inserted into the VITOC 102. Furthermore, the preferred embodiments may provide a range of type and diameter of wire(s) that can be inserted and tightened into the VITOC 102. As a further example, while a connector according to the present disclosure may be designed to optimally capture a single gauge of wire, a connector according to the present disclosure may have a structure capable of receiving an tightening to capture a range of gauges of wire.

With continued reference to FIG. 1, the line voltage of the load line 122 as shown is between 110-277 volts, wherein that specified range is indicative of standard residential voltages. Furthermore, the resistor 112 as shown may have a resistance of 240K Ohms. Furthermore, the indicator 116 may have a resistance of 40 M Ohms. It is further contemplated that the resistor 114 and the indicator 116 may have different resistances than those described in the present disclosure, depending on, for example, the line voltage.

With reference to FIG. 2, an additional diagram illustrating an exemplary embodiment of a circuit configurable for indicating voltage using a twist on connector is shown in accordance with the present disclosure. With continued reference to FIG. 2, a circuit is shown, wherein the circuit may include, but is not limited to, a resistor 112 and an indicator 114, and a testing point 150. In accordance with the present disclosure, the indicator 114 may be a light-emitting diode ("LED"). An LED is a type of diode that works as a semiconductor light source that emits light when current flows through it. In further accordance with the present disclosure, the LED 114 included in the circuit will illuminate if current is passing through the circuit, and alternatively will not illuminate if current is not passing through the circuit, thereby indicating to the observer whether or not electrical current is passing through in the circuit. Currently, there are no twist-on connectors in existence that include LEDs. Accordingly, using VITOCs throughout a site may enable the installer to test for electrical current any time two wires are coupled together using a said VITOC.

With continued reference to the above-mentioned figures, the inclusion of an indicator 114 is not limited to an LED as described hereinabove. It is further contemplated suitable alternative indicators may exist in place of the diode described in the exemplary embodiment in the present disclosure. For example, the diode may be interchangeable with a buzzer, chime, or any other electrical component readily known by persons having ordinary skill in the art to be suitable for the purposes of serving as an indicator.

Figure 3:
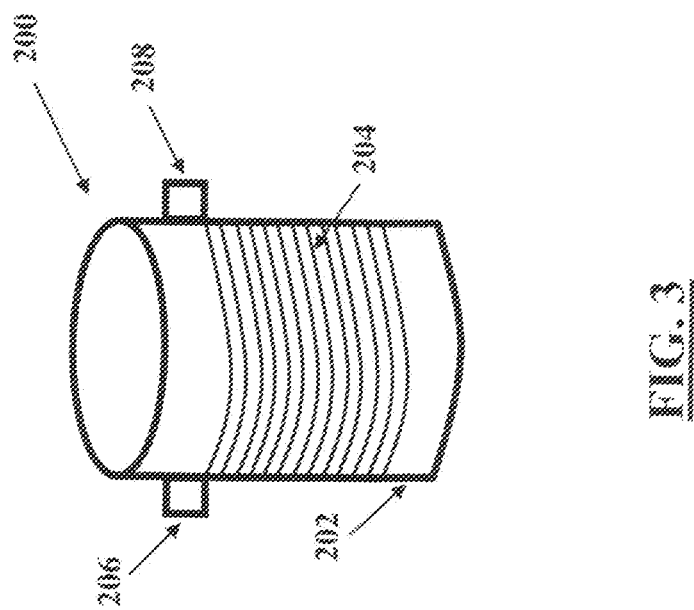
FIG. 3 is an exemplary implementation of a testing tool that may be used in combination with the voltage indicating twist-on connector, in accordance with the present disclosure.

With reference to FIG. 3, a diagram illustrating an exemplary embodiment of a testing tool that may be used in combination with the system for indicating voltage using a twist-on connector, is shown in accordance with the present disclosure. With continued reference to FIG. 3, the testing tool 200 is shown. The testing tool may be comprised from a housing 202, a coil winding 204, and a set of spring loaded contacts comprising a first spring loaded contact 204, and a second spring loaded contact 208. The housing 202 may be of appropriate size to fit over the VITOC 102 described shown and described in the present disclosure. The outer housing may be approximately 63.5 mm (2.5") wide. The coil winding 204 may be an insulated coil winding disposed on the housing 202. The coil winding 208 may be comprised from coil approximately 0.54 mm (0.18") thick wire and may cover approximately 30 mm (1⅜") of the housing 202 with an approximately 0.5 mm (0.2") separation between windings. The coil winding 204 may be coupled together to the set of contacts.

Furthermore, the exemplary testing tool 200 is intended to be used with the VITOC 102 to indicate whether electrical current is passing through a wire. When two wires are coupled together using a VITOC 102, the testing tool 200 may be placed over the VITOC 102 so that the contacts of the testing tool 200 may be in position with the contacts of the VITOC 102. Accordingly, when the testing tool is placed over the VITOC in position and then squeezed, the circuit will be completed causing the indicator to emit a light, indicating to the user that electrical current is passing through the wire.

It is further contemplated that the VITOC 102 and the testing tool 200 may be coupled together to form a singular embodiment. Accordingly, a VITOC may be manufactured as a single unit incorporating the components of the testing tool attached in a fixed position over said VITOC, thereby eliminating the need for a separate testing tool. To actuate the singular embodiment, the user may squeeze the contacts disposed on the housing, thereby completing the circuit within the VITOC, which in turn causes the indicator to illuminate, indicating that electrical voltage is present.

The method of use disclosed in this present disclosure increases the safety and efficiency of working with live electrical wires. By incorporating the use VITOCs, installers may become instantly aware of whether electrical current is flowing through a particular splice together wires. As mentioned hereinabove in the present disclosure, being aware that voltage is present reduces the risk of electrical shock. A single job site may currently include the use of dozens or hundreds of twist-on-connectors. If the installer were to use the VITOCs disclosed in the present disclosure in place of standard twist-on-connectors, then the number of injuries caused by electrical shock will be greatly reduced.

Furthermore, the use of VITOCs may increase the efficiency at which electrical lines are installed and electrical work is completed. An electrician may quickly and easily test lines to determine whether electrical current is present. Once two wires are spliced and coupled together using a VITOC, the electrician may simply cover the VITOC 102 with the testing tool 200, squeeze the contacts on the testing tool, and observe for illumination to determine whether electrical current flowing through the wires. Accordingly, the indicator will emit a light if electrical current is present. One advantage of this system and method is that an electrician may check different lines using the same testing tool 200. For example, if VITOCs are used throughout a building to connect wires together, then the electrician may use the testing tool 202 on any of the installed VITOCs to determine whether electrical current is passing through any of the connected wires. By using VITOCs, the electrician may instantly become aware of whether electrical current is passing through a wire. Furthermore, the use of VITOCs together with the testing tool may enable quick detection of faulty wires, whereby a lack of an emitting light may indicate that no electrical current is passing through a wire.

There are no tools in the current industry capable of indicating voltage in the same manner as the invention disclosed in the present disclosure. As mentioned herein above in this present disclosure, standard voltage testing devices may require a power source, whether that be an internal power source (i.e., batteries) or an external power source. The invention disclosed in the present disclosure does not require its own power source. Rather, voltage is indicated when the circuit inside of the VITOC is completed, through the action of squeezing the contacts, which in turn causes the indicator to illuminate, indicating that voltage is present.

The drawings and descriptions disclosed in the present disclosure are intended to illustrate some but not necessarily the only embodiments of the housing, spiral coil, contacts, resistor, and the indicator, as well as the overall system for indicating voltage using a voltage indicating connector.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A voltage indicating twist on connector, the connector comprising:
    a housing, the housing comprising:
        a proximal end comprising an opening for insertion of a wire,
        a distal end comprising a closed butt-end to block the wire from extending past the connector,
        an interior surface, and
        an exterior surface;
    a spiral coil, wherein the spiral coil is disposed on the interior surface of the housing;
    a set of contacts, wherein the set of contacts is disposed on the exterior surface of the housing, electrically connected to the spiral coil, the set of contacts comprising:
        a first contact, and
        a second contact;
    a resistor; and
    an indicator;
    wherein the spiral coil, the set of contacts, the resistor, and the indicator are electrically connected together in a circuit disposed within the housing;
    wherein upon inserting the wire into the housing and rotating the connector, the circuit within the housing is completed, which causes the connector to actuate the indicator to indicate whether voltage is present in the wire connected to the connector upon squeezing the set of contacts.

2. A system for indicating voltage using voltage indicating twist-on connector, the system comprising
    a voltage indicating twist-on connector, the connector comprising
        a housing, the housing comprising
        an interior surface, and
        an exterior surface,
        a spiral coil, wherein the spiral coil is disposed on the interior surface of the housing of the connector,
        a set of contacts, the set of contacts comprising
        a first contact, and
        a second contact,
        a resistor, and
        an indicator,
        wherein the spiral coil, the set of contacts, the resistor, and the indicator are electrically connected together in a circuit connected to the connector,
    a testing tool, the testing tool comprising
        a housing;
        a coil winding, wherein the coil winding is disposed on the housing of the testing tool;
        a set of spring loaded contacts, the set of spring loaded contacts comprising
        a first spring loaded contact; and a second spring loaded contact,
wherein the testing tool is configurable to fit over the voltage indicating twist-on connector, so that when the testing tool spring loaded contacts are actuated the connector will illuminate if voltage is present in a wire connected to the connector.

3. A method for indicating whether voltage is present in an electrical line using a voltage indicating twist on connector, the method comprising the steps of
stripping at least one wire of insulation,
inserting the at least one wire into a voltage indicating twist-on connector,
rotating the connector, wherein rotating the connector causes the wire to become secured in a fixed position in the connector and electrically connects the wire to the connector,
placing a testing tool over the connector,
aligning a set of spring loaded contacts of the testing tool with a set of contacts of the connector,
squeezing the spring loaded contacts of the testing tool, wherein squeezing the spring loaded contacts causes a circuit connected to the connector to become complete,
observing whether an indicator connected to the circuit illuminates, wherein illumination of the indicator indicates electrical voltage is present in the at least one wire connected to the connector.

* * * * *